(12) United States Patent
Kobayashi et al.

(10) Patent No.: US 10,164,652 B2
(45) Date of Patent: Dec. 25, 2018

(54) A/D CONVERSION DEVICE

(71) Applicant: Mitsubishi Electric Corporation, Tokyo (JP)

(72) Inventors: Yusuke Kobayashi, Tokyo (JP); Takayasu Narukawa, Tokyo (JP); Masaya Tsuneoka, Tokyo (JP); Masayuki Funakoshi, Tokyo (JP); Norihiro Yamaguchi, Tokyo (JP); Takahiro Okanoue, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/752,096

(22) PCT Filed: Nov. 11, 2015

(86) PCT No.: PCT/JP2015/081692
§ 371 (c)(1),
(2) Date: Feb. 12, 2018

(87) PCT Pub. No.: WO2017/081759
PCT Pub. Date: May 18, 2017

(65) Prior Publication Data
US 2018/0241411 A1    Aug. 23, 2018

(51) Int. Cl.
*H03M 1/12* (2006.01)
*H03M 1/36* (2006.01)
*H03M 1/10* (2006.01)

(52) U.S. Cl.
CPC ......... *H03M 1/362* (2013.01); *H03M 1/1071* (2013.01); *H03M 1/123* (2013.01)

(58) Field of Classification Search
CPC ..... H03M 1/362; H03M 1/1071; H03M 1/123
(Continued)

(56) References Cited

U.S. PATENT DOCUMENTS 9,641,189 B2 *  5/2017  Maddox ............. H03M 1/1071
9,780,802 B1 * 10/2017  Kim .................... H03M 1/1033
(Continued)

FOREIGN PATENT DOCUMENTS

| JP | 60-020159 A | 2/1985 |
|---|---|---|
| JP | 2007-333574 A | 12/2007 |
| JP | 2013-225781 A | 10/2013 |

OTHER PUBLICATIONS

International Search Report for PCT/JP2015/081692 dated Jan. 12, 2016 [PCT/ISA/210].

*Primary Examiner* — Brian Young
(74) *Attorney, Agent, or Firm* — Sughrue Mion, PLLC; Richard C. Turner (57) ABSTRACT

A first mode in which to output analog electricity quantities of objects one by one independently to an A/D converter, a second mode in which to output none of the analog electricity quantities of the objects, a third mode in which to output none of the analog electricity quantities of the objects and cause the output to the A/D converter to be resistor, and a fourth mode in which to output to the A/D converter a plurality of the analog electricity quantities of the objects at the same time, are caused to be generated, thus acquiring the A/D conversion values of the objects individually when in the first mode, and detecting an anomaly of the A/D converter itself or a device connected to the A/D converter when in the second mode to the fourth mode.

6 Claims, 7 Drawing Sheets

(58) Field of Classification Search
USPC .................................................. 341/155, 120
See application file for complete search history.

(56) References Cited

U.S. PATENT DOCUMENTS

| | | | |
|---|---|---|---|
| 9,912,343 B1* | 3/2018 | Li | H03M 1/1009 |
| 10,009,036 B2* | 6/2018 | Loke | H03L 7/0996 |
| 2007/0290905 A1 | 12/2007 | Kobayashi et al. | |

* cited by examiner

A/D CONVERSION DEVICE

CROSS REFERENCE TO RELATED APPLICATIONS

This application is a National Stage of International Application No. PCT/JP2015/081692 filed Nov. 11, 2015, the contents of all of which are incorporated herein by reference in their entirety.

BACKGROUND OF THE INVENTION

Field of the Invention

The present invention relates to an A/D conversion device which converts analog quantities to digital quantities.

Description of the Related Art

Heretofore, there has been a CPU which holds a plurality of A/D converters which convert analog quantities to a form of digital quantities which a CPU (Central Processing Unit) or the like can use. In recent years, analog signals which the CPU inputs with one system are increasing, and the absolute number of A/D converters (A/D ports in the CPU) is deficient. Thus, for example, as is disclosed in JP-A-2007-333574 (PTL 1), a method whereby items of information inputted into an A/D converter are selectively switched and used by using an interface circuit is adopted.

The usage pattern of the A/D converter disclosed in PTL 1 is such that a plurality of items of information to be inputted are selectively switched by a switch and inputted into an MPU (Micro-processing unit). This configuration enables the number of items of input information to be increased without increasing the number of A/D converters.

However, this kind of heretofore known device is simply such as to suppress the number of A/D converters, and in this system, as a switch which switches items of input information is added, it is also necessary to enhance a failure diagnosis function for the switch, and in this case, the necessity cannot help but be met by providing an additional circuit separately.

Thus, the present inventors and others have proposed an A/D conversion device wherein it is possible to add a failure diagnosis function without increasing the number of A/D converters and without providing an additional circuit, as disclosed in JP-A-2013-225781 (PTL 2).

PTL 1: JP-A-2007-333574
PTL 2: JP-A-2013-225781

In the A/D conversion device disclosed in PTL 2, the number of A/D converters can be suppressed, but it is impossible to detect anomalies of the A/D converter itself and a device connected to the A/D converter, and the necessity for the anomaly detection has arisen.

SUMMARY OF THE INVENTION

The invention, having been contrived in light of the heretofore mentioned actual circumstances, has an object of providing an A/D conversion device which, as well as suppressing the number of A/D converters using a minimum necessary additional part, detects anomalies of the A/D converter itself and a device connected to the A/D converter.

The A/D conversion device according to the invention is an A/D conversion device including: an A/D converter which converts analog electricity quantities of objects to be detected to digital quantities; switching circuits which connect a plurality of the analog electricity quantities to the A/D converter; and a control section which controls the switching circuits independently of each other, the A/D conversion device being characterized in that the control section causes to be generated
a first mode in which to output the analog electricity quantities of the objects one by one independently to the A/D converter, a second mode in which to output none of the analog electricity quantities of the objects, a third mode in which to output none of the analog electricity quantities of the objects and cause the output to the A/D converter to be pulled down by a resistor, and a fourth mode in which to output to the A/D converter a plurality of the analog electricity quantities of the objects at the same time, thus acquiring the A/D conversion values of the objects individually when in the first mode, and detecting an anomaly of the A/D converter itself or a device connected to the A/D converter when in the second mode to the fourth mode.

According to the A/D conversion device of the invention, there are the advantages that a large number of analog electrical signals targeted as signals to be incorporated can be sequentially converted to digital signals by an A/D converter, and incorporated, without increasing the number of A/D converters, and furthermore, that a failure diagnosis function can be added using a simple additional circuit.

The foregoing and other objects, features, aspects and advantages of the present invention will become more apparent from the following detailed description of the present invention when taken in conjunction with the accompanying drawings.

DETAILED DESCRIPTION OF THE PREFERRED EMBODIMENTS

Hereafter, a detailed description will be given, with reference to the drawings, of preferred embodiments of an A/D conversion device according to the invention.

Embodiment 1

Figure 1:
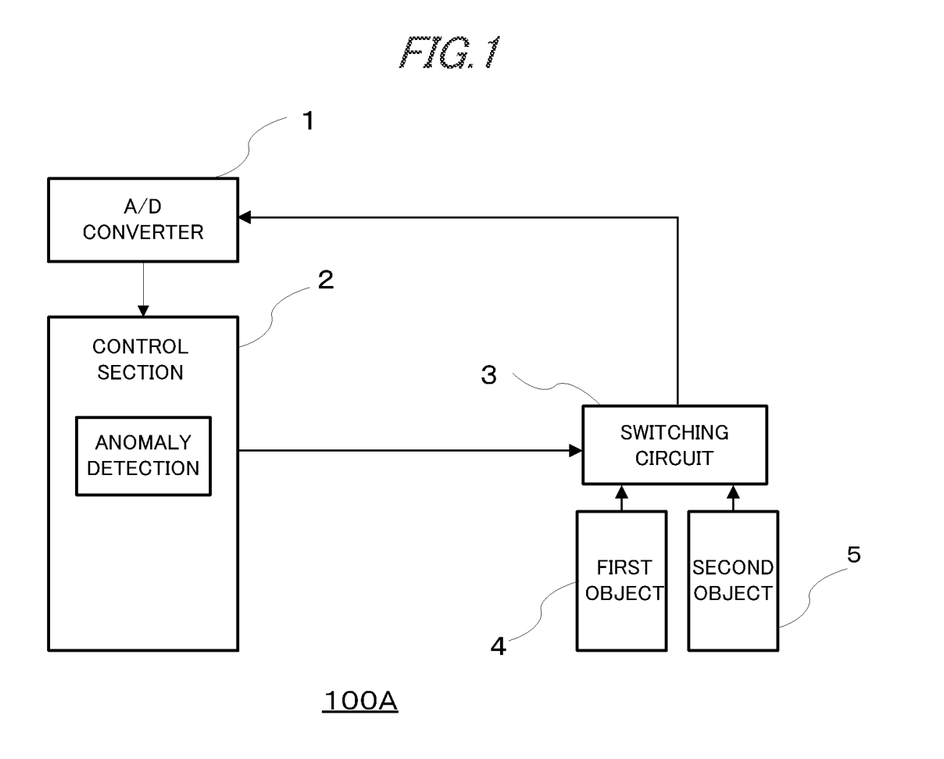
FIG. 1 is a block diagram of an A/D conversion device according to Embodiment 1 of the invention.

FIG. 1 is a block diagram of an A/D conversion device according to Embodiment 1 of the invention. In FIG. 1, an A/D conversion device 100A is configured so that a control section 2 can control and output the analog electricity quantities of a first object 4 and a second object 5, independently of each other, via a switching circuit 3 to an A/D converter 1.

Figure 2:
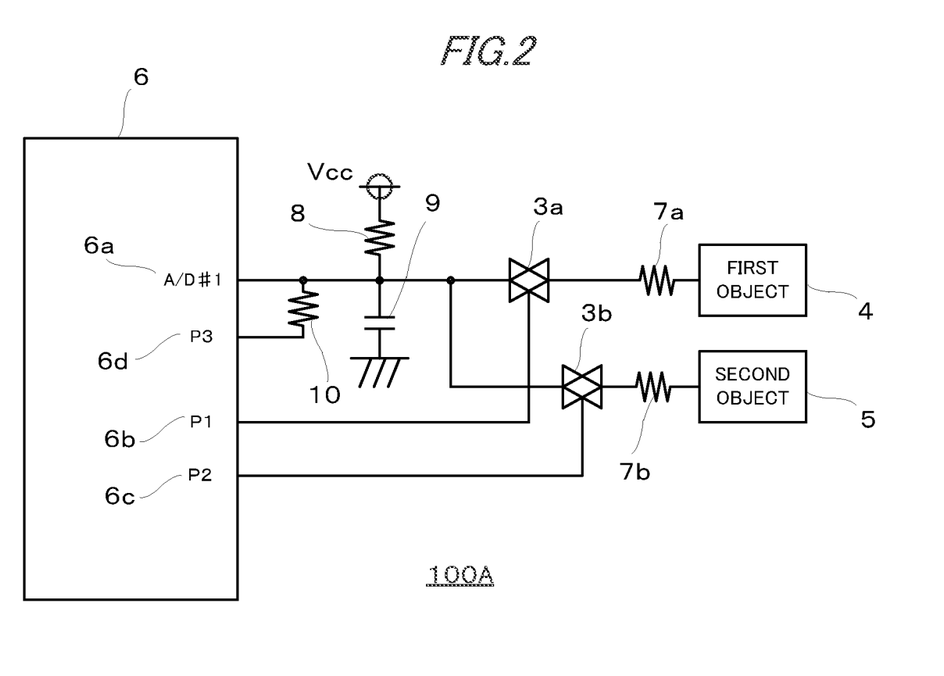
FIG. 2 is a circuit diagram of the A/D conversion device according to Embodiment 1 of the invention.

FIG. 2 is a circuit diagram of the A/D conversion device 100A and shows the state in which a CPU 6 has the built-in A/D converter 1 shown in FIG. 1. The CPU 6 has an A/D port (A/D#1) 6a and ordinary first, second, and third output ports (P1, P2, and P3) 6b, 6c, and 6d. Electrical signals which the first object 4 and second object 5 output are outputted through a first series resistor 7a and a second series resistor 7b, via a first switching circuit 3a and a second switching circuit 3b which are controlled by the first output port 6b and the second output port 6c, respectively, to the A/D port 6a. The first switching circuit 3a and the second switching circuit 3b are each configured of an analog switch.

The first object 4 and the second object 5 generate electrical signals which change independently of each other, and each signal is transmitted to the A/D port 6a in response to an on operation of the first switching circuit 3a or the second switching circuit 3b connected respectively to the first object 4 or the second object 5. A first resistor 8 as a pull-up resistor and a capacitor 9, other than the A/D port 6a, are connected to the common terminal of the first switching circuit 3a and the second switching circuit 3b with respect respectively to a power source Vcc and the ground, and furthermore, are connected to the third port 6d via a second resistor 10 as a pulldown resistor, thus configuring an interface circuit.

As shown in the heretofore mentioned circuit diagram, the A/D conversion device 100A according to Embodiment 1 is configured by the first object 4 and second object 5 being connected to one A/D port 6a. Next, a description will be given of an operation of the A/D conversion device 100A according to Embodiment 1.

Figure 3:
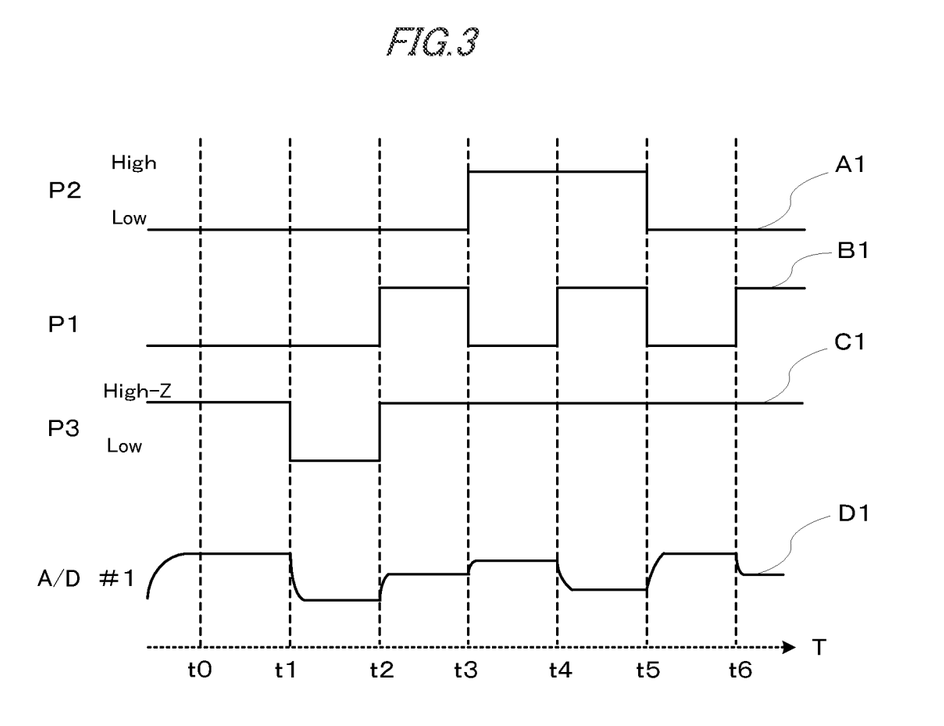
FIG. 3 is a time chart describing an operation of the A/D conversion device according to Embodiment 1 of the invention.

FIG. 3 is a time chart describing an operation of the A/D conversion device 100A according to Embodiment 1. In FIG. 3, the symbol A1 shows the operating state of the second output port 6c, the symbol B1 shows the operating state of the first output port 6b, and the symbol C1 shows the operating state of the third output port 6d, each of which is shown along the passage of time T. Also, the symbol D1 shows the input state of the A/D port 6a.

First, as a first mode, when focusing on time t2 to t3 of FIG. 3, the second output port 6c=Low, the first output port 6b=High, and the third output port 6d=High-Z (Z is impedance). This represents that the second switching circuit 3b connected to the second output port 6c is off controlled, the path of the second resistor 10 connected to the third output port 6d is placed in an open state, and the first switching circuit 3a connected to the first output port 6b is on controlled. By only the first switching circuit 3a being on controlled, the signal from the first object 4 is inputted into the A/D port 6a by way of a voltage dividing circuit formed of the first series resistor 7a and the first resistor 8, and only the signal from the first object 4 is incorporated into the CPU 6.

Next, when focusing on time t3 to t4 of FIG. 3, in the same way as heretofore mentioned, by only the second switching circuit 3b being on controlled, only the signal from the second object 5 is inputted into the A/D port 6a, and only the signal from the second object 5 is incorporated into the CPU 6 by way of a voltage dividing circuit formed of the second series resistor 7b and the first resistor 8.

By the two controls, the signals generated by the first object 4 and the second object 5 are, independently of each other, inputted into one A/D port 6a, and the CPU 6 can acquire the values of the signals. The above is the content implemented by a heretofore known device.

Next, the A/D conversion device 100A according to Embodiment 1 is such that a failure diagnosis is also carried out by adding another simple control, subsequently to the input of the heretofore known device.

First, as a second mode, for time t0 to t1 of FIG. 3, both the first output port 6b and the second output port 6c are set to Low, the third output port 6d is set to High-Z, both the first switching circuit 3a and the second switching circuit 3b are off controlled, and the path of the second resistor 10 is placed in an open state, thus preventing the signals from the first object 4 and the second object 5 being connected to the A/D port 6a. As only the first resistor 8 is connected in this state, approximately the same voltage as the voltage of the power source Vcc which is the other connection point of the first resistor 8 is inputted into the A/D port 6a. When the A/D conversion device 100A is normal, the voltage of the power source Vcc is inputted, but when a voltage other than the voltage of the power source Vcc is inputted, it can be determined that the A/D conversion device 100A is in an anomalous state.

That is, there is the possibility of an open state of the first resistor 8, a short circuit failure of the first switching circuit 3a or the second switching circuit 3b, a poor H fixation of at least either the first output port 6b or the second output port 6c, a poor L fixation of the third output port 6d, or an anomaly of the A/D converter 1, and this is a failure detection state.

Next, as a third mode, for time t1 to t2 of FIG. 3, all the first output port 6b, the second output port 6c, and the third output port 6d are set to Low, both the first switching circuit 3a and the second switching circuit 3b are turned off, and the path of the second resistor 10 is placed in an on state. In this case, a voltage wherein the voltage of the power source Vcc is divided by the first resistor 8 and the second resistor 10 is inputted into the A/D port 6a, but when it is confirmed in the heretofore mentioned that the power source Vcc is normal, and when a voltage deviating from a voltage which is assumed in the case of a normal resistance value is inputted, it can be determined that there is a resistance value anomaly of the first resistor 8 or the second resistor 10.

Finally, as a fourth mode, for time t4 to t5 of FIG. 3, both the first output port 6b and the second output port 6c are set to High, both the first switching circuit 3a and the second switching circuit 3b are kept to on, and both signal inputs from the first object 4 and the second object 5 are placed in the state of being connected to the A/D port 6a (the third output port 6d is set to High-Z, and the path of the second resistor 10 is placed in an open state). In this case, the combined voltage of the signals from the first object 4 and the second object 5 are inputted into the A/D port 6a by a voltage combining/dividing circuit formed of the first resistor 8, the first series resistor 7a connected to the first object 4, and the second series resistor 7b connected to the second object 5 in the same way. When switching operations for the time t0 to t5 are of a sufficiently high speed with respect to a change in the signals generated by the first object 4 and the second object 5, the signals from the first object 4 and the second object 5 are incorporated for the time t2 to t3 and the time t3 to t4, and the constant of the voltage combining/dividing circuit is also known, it thus being possible to confirm the validity of the combined voltage.

That is, an open/short circuit/resistance anomaly of the first series resistor 7a and the second series resistor 7b, an open failure of the first switching circuit 3a or the second switching circuit 3b, a poor L fixation of at least either the first output port 6b or the second output port 6c, or an anomaly of the A/D converter 1 can be detected as a failure by voltage identification for the time t4 to t5.

In other words, as it is determined that the device is anomalous when the voltages inputted into the A/D port 6a for the time t0 to t1 and the time t1 to t2 of FIG. 3 are each a voltage other than the voltage of the power source Vcc or a resistor divided voltage wherein the voltage of the power source Vcc is divided by the first resistor 8 and the second resistor 10, or when the voltage inputted into the A/D port 6a for the time t4 to t5 is not in alignment with a calculation based on the signal incorporation values of the first object 4 and the second object 5 for the time t2 to t3 and the time t3 to t4, it is possible to increase the number of A/D conversion channels, and at the same time, to include a switching circuit and also a failure detection function of the A/D converter 1, without complicating the configuration of the first switching circuit 3a and the second switching circuit 3b, and therefore, it is possible to improve the reliability of a signal conversion result.

In the heretofore mentioned, a description has been given of two detection objects and one A/D port, but the invention not being limited to this, the same advantages can also be obtained when still more objects are connected to one A/D port.

Embodiment 2

Figure 4:
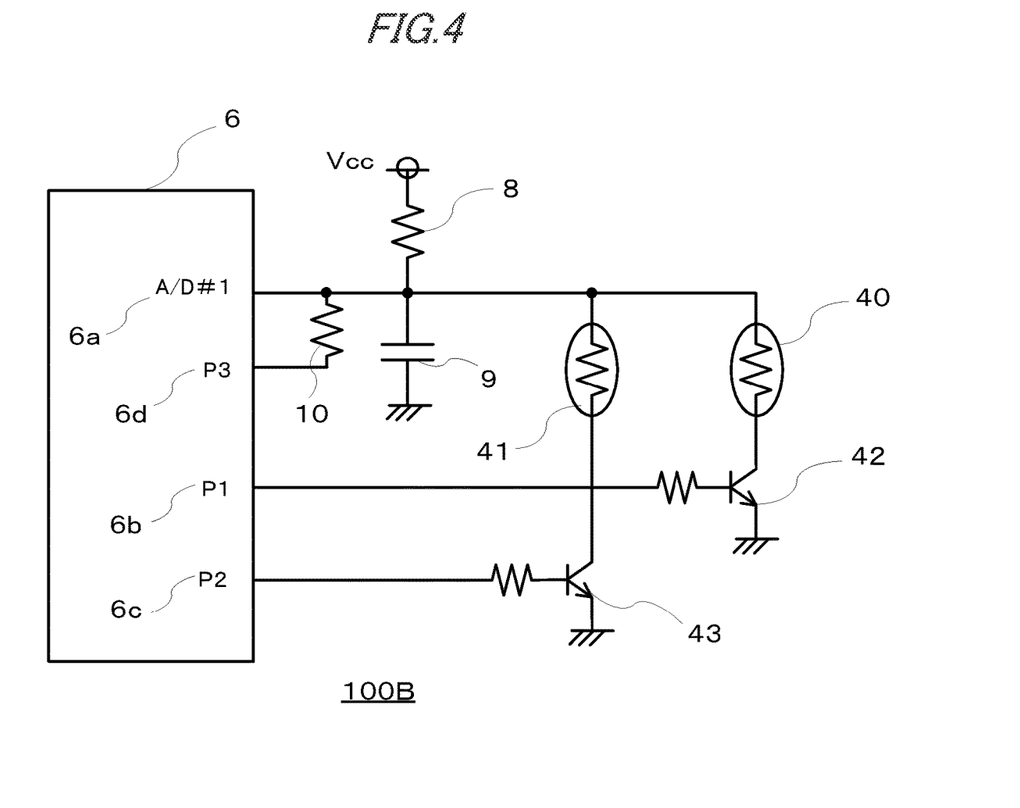
FIG. 4 is a circuit diagram of an A/D conversion device according to Embodiment 2 of the invention.

Next, a description will be given of an A/D conversion device according to Embodiment 2 of the invention. FIG. 4 is a circuit diagram of an A/D conversion device 100B according to Embodiment 2, and shows the state in which the CPU 6 has the built-in A/D converter 1 shown in FIG. 1. The CPU 6 has the A/D port (A/D#1) 6a and the ordinary first, second, and third output ports (P1, P2, and P3) 6b, 6c, and 6d. A first sensor 40 and a second sensor 41 similar to the first sensor 40 are connected in parallel to the A/D port 6a. The first sensor 40 and second sensor 41 are such that their respective resistance values Rt1 and Rt2 change in response to the characteristics of the first and second sensors. For example, the first and second sensors are one whose resistance value changes by being movable like a potentiometer or thermistor which has a resistance change due to a temperature change.

The first sensor 40 and the second sensor 41 are pulled up to the power source Vcc via the first resistor 8. Also, a first switching element 42 and a second switching element 43, each of which is formed of a bipolar transistor, are connected in series, respectively, to the first sensor 40 and the second sensor 41. The first switching element 42 and the second switching element 43 are controlled by being connected respectively to the first output port 6b and the second output port 6c. The capacitor 9 is connected to the A/D port 6a for the purpose of noise suppression. Also, the A/D port 6a is connected to the third output port 6d via the second resistor 10.

Figure 5:
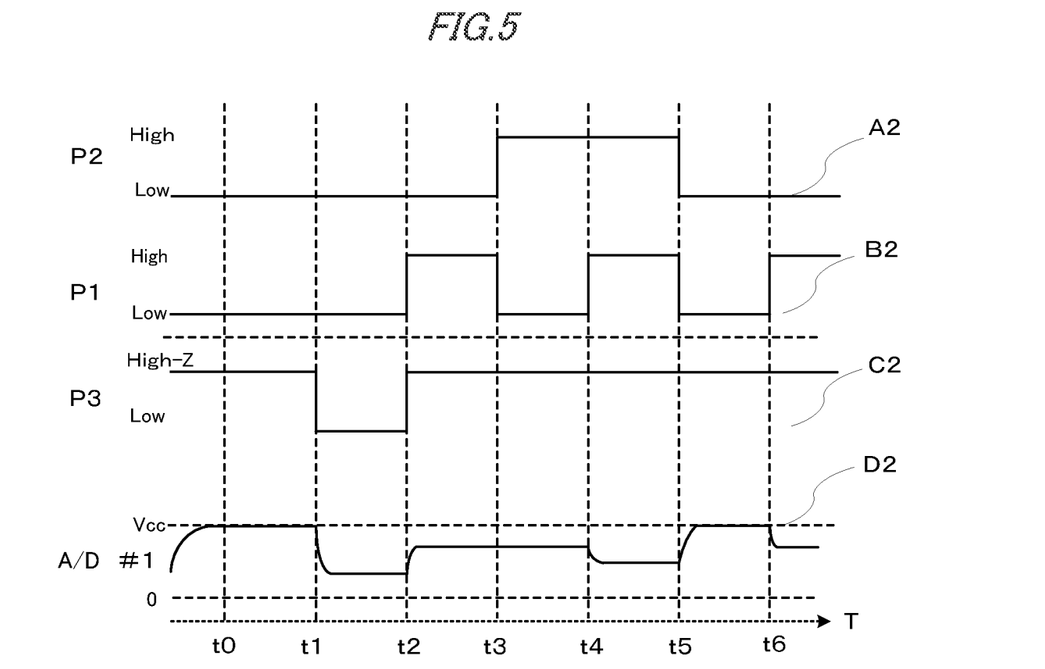
FIG. 5 is a time chart describing an operation of the A/D conversion device according to Embodiment 2 of the invention.

FIG. 5 is a time chart describing an operation of the A/D conversion device 100B according to Embodiment 2. In FIG. 5, the symbol A2 shows an operating state of the second output port 6c, the symbol B2 shows an operating state of the first output port 6b, and the symbol C2 shows an operating state of the third output port 6d, each of which is shown along the passage of time T. Also, the symbol D2 shows an input condition of the A/D port 6a.

First, as a first mode, when focusing on time t2 to t3 of FIG. 5, the second output port 6c=Low, the first output port 6b=High, and the third output port 6d=High-Z (Z is impedance). This represents that the second switching element 43 connected to the second output port 6c is off controlled, the path of the second resistor 10 is placed in an open state, and the first switching element 42 connected to the first output port 6b is on controlled. By the first switching element 42=on, only the first sensor 40 is connected, and the second sensor 41 is in an open state. Because of this, a voltage division ratio between the resistance value Rt1 of the first sensor 40 and the resistance value of the first resistor 8 is inputted into the A/D port 6a.

Next, when focusing on time t3 to t4 of FIG. 5, in the same way as heretofore mentioned, only the second sensor 41 is connected, as a result of which a voltage division ratio between the resistance Rt2 of the second sensor 41 and the resistance value of the first resistor 8 is inputted into the A/D port 6a. By these two controls, detection signals from the first sensor 40 and second sensor 41 are each inputted into the A/D port 6a, and the CPU 6 can obtain each signal value. The above is the content implemented by the heretofore known device.

Next, the A/D conversion device 100B according to Embodiment 2 also carries out a failure determination by adding another simple control, subsequently to the input of the heretofore known device.

First, as a second mode, for time t0 to t1 of FIG. 5, both the first output port 6b and the second output port 6c are set to Low, both the first switching element 42 and the second switching element 43 are off controlled, and the first sensor 40 and the second sensor 41 are not connected. Also, the third output port 6d is set to High-Z, and the path of the second resistor 10 is placed in an open state. As only the first resistor 8 is connected in this state, approximately the same voltage as the voltage of the power source Vcc which is the other connection point of the first resistor 8 is inputted into the A/D port 6a. When the device is normal, the voltage of the power source Vcc is inputted, but when a voltage other than the voltage of the power source Vcc is inputted, there is the possibility that the first resistor 8, the power source Vcc, the A/D port 6a, the first switching element 42 and/or the second switching element 43, any one of the first output port 6b, the second output port 6c, and the third output port 6d is defective, meaning that neither of the input values of the first sensor 40 and the second sensor 41 can be determined to be a true value.

Next, as a third mode, for time t1 to t2, all the first output port 6b, the second output port 6c, and the third output port 6d are set to Low, both the first switching element 42 and the second switching element 43 are turned off, the first sensor 40 and the second sensor 41 are not connected. The path of the second resistor 10 is placed in an on state. In this case, a voltage wherein the voltage of the power source Vcc is divided by the first resistor 8 and the second resistor 10 is inputted into the A/D port 6a, but when it is confirmed in the heretofore mentioned that the power source Vcc is normal, and when a voltage deviating from a voltage which is assumed in the case of a normal resistance value is inputted, it can be determined that the resistance value of the first resistor 8 or the second resistor 10 is anomalous.

Finally, as a fourth mode, for time t4 to t5 of FIG. 5, both the first output port 6b and the second output port 6c are set to High, both the first switching element 42 and the second switching element 43 are turned on, the third output port 6d is set to High-Z, and the first sensor 40 and the second sensor 41 are placed in the state of being connected. That is, the first sensor 40 and the second sensor 41 are in the state of being connected in parallel. Because of this, it can be determined that there is a failure unless a value lower than the values of the first sensor 40 and the second sensor 41 inputted for the time t2 to t4 is attained.

Herein, for the time t4 to t5 of FIG. 5, it is also possible to determine the validity of a detection value by using converting means, such as a look-up table, to compare correlation values wherein a voltage response value in the case where the first sensor 40 and the second sensor 41 are connected in parallel in advance corresponds to how many volts of a voltage response value in the case where only the first sensor 40 or the second sensor 41 is connected individually.

A failure of the first sensor 40 and/or the second sensor 41, a failure of the first switching element 42, the second switching element 43, the first output port 6*b*, the second output port 6*c*, or the third output port 6*d*, or the like, can be considered as a failure mode, but in any case, the values of the first sensor 40 and the second sensor 41 inputted for the time t2 to t4 cannot be determined as true values.

On the other hand, when there are normal values for the time t0 to t2 and the time t4 to t5, the values acquired by the first sensor 40 and the second sensor 41 can also be determined to be normal. In this way, there is the advantage of being able to add a fail-safe function, too, using the same circuit by adding a mode which differs from the control content of each sensor between before and after detecting the individual sensors independently of each other.

Figure 6:
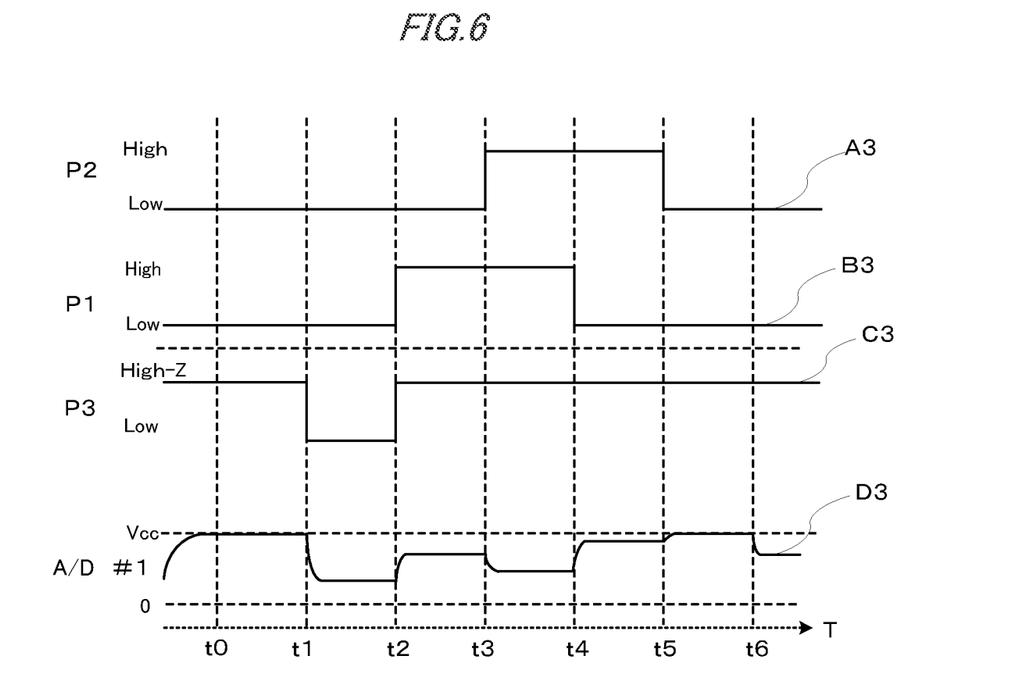
FIG. 6 is another time chart describing an operation of the A/D conversion device according to Embodiment 2 of the invention.

The time chart shown in FIG. 5 shows one example of the operation, and it is free to set a switching pattern as far as the individual modes can be realized in sequence. For example, a time chart, such as shown in FIG. 6, may be used as another switching pattern, and it is possible to provide a signal selection and failure detection function in the same way as in the case of the time chart of FIG. 5. A3, B3, C3, and D3 of FIG. 6 show operating states corresponding to A2, B2, C2, and D2 of FIG. 5, respectively.

A description has been given of two sensors and one A/D port, but the invention not being limited to this, it is also possible to obtain the same advantages when still more sensors are connected.

Also, in the present embodiment, a bipolar transistor is exemplified as the switching element, but the invention not being limited to this, as far as the switching element is an element, such as a MOSFET, an analog switch IC, or a mechanical relay, which has conduction/cutoff characteristics which can be satisfactory after taking into consideration the required precision of A/D conversion on application, it goes without saying that it is possible to use the element freely.

Embodiment 3

Figure 7:
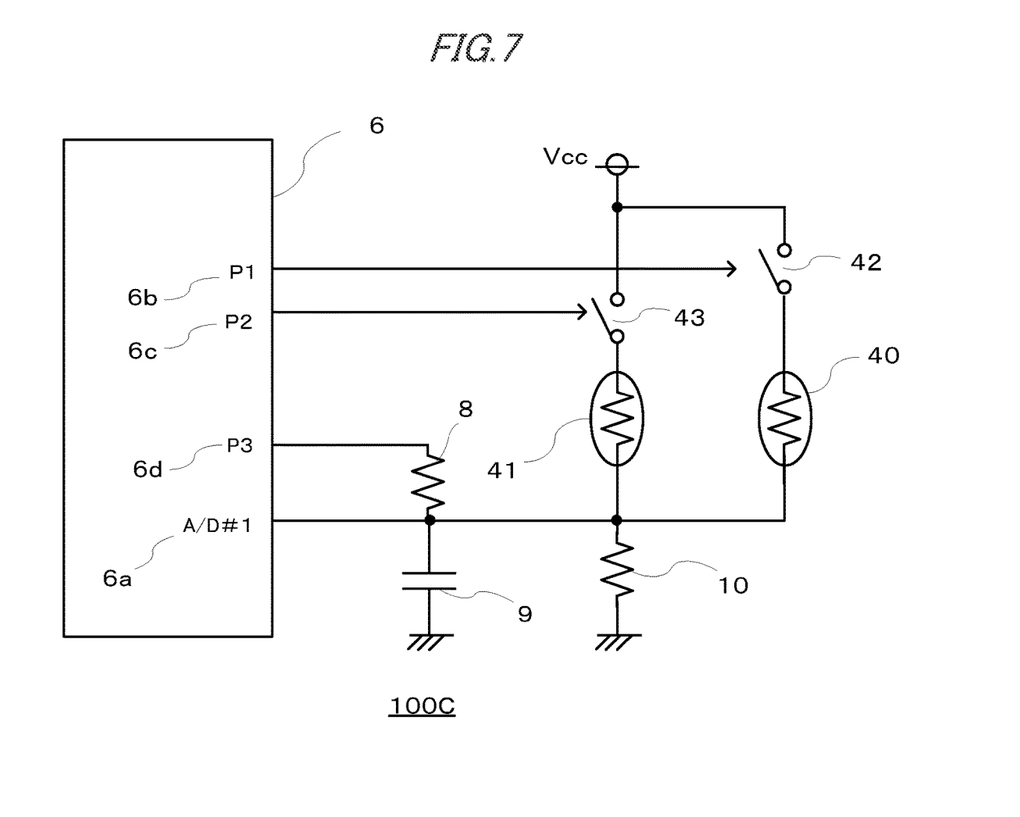
FIG. 7 is a circuit diagram of an A/D conversion device according to Embodiment 3 of the invention.

Next, a description will be given of an A/D conversion device according to Embodiment 3 of the invention. FIG. 7 is a circuit diagram of an A/D conversion device 100C according to Embodiment 3. In Embodiment 2, the first switching element 42 and the second switching element 43 are connected to the ground side, but may be connected to the power source Vcc side as shown in FIG. 7. In this case, the first resistor 8 of FIG. 4 is connected to the ground side as the pull-down resistor 10. An operation in the case of this configuration will be described below by focusing on the difference from when the heretofore mentioned first switching element 42 and the second switching element 43 are connected to the ground side.

In FIG. 7, as a check target is the first resistor 8, in the heretofore mentioned third mode, the first output port 6*b* and the second output port 6*c* are set to Low, the third output port 6*d* is set to High, both the first switching element 42 and the second switching element 43 are turned off, and the first sensor 40 and the second sensor 41 are not connected. The path of the second resistor 10 is placed in an on state. In this case, when a voltage outputted from the third output port 6*d*, which is High divided by the first resistor 8 and the second resistor 10, is inputted into the A/D port 6*a*, and a voltage deviating from a voltage which is assumed in the case of a normal resistance value is inputted, it can be determined that the resistance value of the first resistor 8 or the second resistor 10 is anomalous.

In the heretofore described A/D conversion devices 100A, 100B, and 100C in Embodiments 1 to 3, the pull-down destinations of the second resistor 10 of the A/D converters 100A and 100B or the pull-up destination of the second resistor 10 of the A/D converter 100C is not always necessarily the output port 6*d*, and it is possible to obtain the same advantages even when the first switching element 42 and the second switching element 43 are connected to the power source Vcc or ground side.

In the heretofore mentioned, a description has been given of the A/D conversion devices according to Embodiments 1 to 3 of the invention, but the invention is such that it is possible to combine the individual embodiments, and appropriately change or omit any of the embodiments, within the scope of the invention.

What is claimed is:

1. An A/D conversion device, comprising:
an A/D converter which converts analog electricity quantities of objects to be detected to digital quantities; switching circuits which connect a plurality of the analog electricity quantities to the A/D converter; and a control section which controls the switching circuits independently of each other, the A/D conversion device being characterized in that
the control section causes to be generated
a first mode in which to output the analog electricity quantities of the objects one by one independently to the A/D converter, a second mode in which to output none of the analog electricity quantities of the objects, a third mode in which to output none of the analog electricity quantities of the objects and cause the output to the A/D converter to be pulled down by a resistor, and a fourth mode in which to output to the A/D converter a plurality of the analog electricity quantities of the objects at the same time,
thus acquiring the A/D conversion values of the objects individually when in the first mode, and detecting an anomaly of the A/D converter itself or a device connected to the A/D converter when in the second mode to the fourth mode.

2. The A/D conversion device according to claim 1, characterized in that
in the second mode, an anomaly of the A/D conversion device is detected with reference to a power source voltage connected to the A/D converter, in the third mode, an anomaly of a part connected to the A/D converter is detected based on the A/D conversion values, and in the fourth mode, an anomaly of a device connected to the A/D converter is detected based on the A/D conversion values.

3. The A/D conversion device according to claim 1, comprising:
a first resistor pulled up to the power source side with respect to the A/D converter when the switching circuits are connected to the ground side with respect to the A/D converter; and a second resistor connected in series to the first resistor, the A/D conversion device being characterized in that
the side of the second resistor opposite the connection thereof to the first resistor is connected to the control section, thus driving so as to pull up or pull down the second resistor in the third mode.

4. The A/D conversion device according to claim 2, comprising:
 a first resistor pulled up to the power source side with respect to the A/D converter when the switching circuits (3) are connected to the ground side with respect to the A/D converter; and
 a second resistor connected in series to the first resistor, the A/D conversion device being characterized in that
 the side of the second resistor opposite the connection thereof to the first resistor is connected to the control section, thus driving so as to pull up or pull down the second resistor in the third mode.

5. The A/D conversion device according to claim 1, comprising:
 a first resistor pulled down to the ground side with respect to the A/D converter when the switching circuits are connected to the power source side with respect to the A/D converter; and
 a second resistor connected in series to the first resistor, the A/D conversion device being characterized in that
 the side of the second resistor opposite the connection thereof to the first resistor is connected to the control section, thus driving so as to pull up or pull down the second resistor in the third mode.

6. The A/D conversion device according to claim 2, comprising:
 a first resistor pulled down to the ground side with respect to the A/D converter when the switching circuits are connected to the power source side with respect to the A/D converter; and
 a second resistor connected in series to the first resistor, the A/D conversion device being characterized in that
 the side of the second resistor opposite the connection thereof to the first resistor is connected to the control section, thus driving so as to pull up or pull down the second resistor in the third mode.

* * * * *